United States Patent
Shimooka

(10) Patent No.: US 7,788,558 B2
(45) Date of Patent: Aug. 31, 2010

(54) SEMICONDUCTOR INTEGRATED CIRCUIT AND CONTROL METHOD THEREOF

(75) Inventor: Masaaki Shimooka, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 401 days.

(21) Appl. No.: 11/907,209

(22) Filed: Oct. 10, 2007

(65) Prior Publication Data

US 2008/0092002 A1 Apr. 17, 2008

(30) Foreign Application Priority Data

Oct. 13, 2006 (JP) ............................. 2006-280609
Sep. 10, 2007 (JP) ............................. 2007-233527

(51) Int. Cl.
*G01R 31/28* (2006.01)
(52) U.S. Cl. ...................................................... 714/726
(58) Field of Classification Search .................. 714/726
See application file for complete search history.

(56) References Cited

U.S. PATENT DOCUMENTS

| | | | |
|---|---|---|---|
| 7,269,780 B2 * | 9/2007 | Arima et al. ................. | 714/764 |
| 7,392,448 B2 * | 6/2008 | De Poorter et al. .......... | 714/726 |
| 7,461,242 B2 * | 12/2008 | Grossman et al. ........... | 712/228 |
| 7,587,643 B1 * | 9/2009 | Chopra ........................ | 714/726 |
| 2004/0153762 A1 * | 8/2004 | Flynn et al. .................... | 714/15 |
| 2005/0149799 A1 | 7/2005 | Hemia et al. | |

FOREIGN PATENT DOCUMENTS

| | | |
|---|---|---|
| JP | 6-52070 | 2/1994 |
| JP | 2002-196846 | 7/2002 |
| JP | 2004-164647 | 6/2004 |

* cited by examiner

*Primary Examiner*—James C Kerveros
(74) *Attorney, Agent, or Firm*—McGinn IP Law Group PLLC

(57) ABSTRACT

A semiconductor integrated circuit includes a target circuit configured to operate in a normal mode, to form a scan chain to serially transfer a test data through the scan chain, in a scan path test mode, and to form a plurality of sub scan chains to save an internal node data in a memory in a save mode; and a backup control circuit configured to supply to the target circuit, a system clock signal in the normal mode, a test clock signal in the scan path test mode, and a save/recover clock signal in the save mode, and to control the target circuit and the memory such operations in the normal mode, the scan path test mode, and the save mode are performed. The test clock signal is slower than the system clock signal, and the save/recover clock signal is slower than the system clock signal and faster than the test clock signal.

20 Claims, 8 Drawing Sheets

SEMICONDUCTOR INTEGRATED CIRCUIT AND CONTROL METHOD THEREOF

BACKGROUND OF THE INVENTION

1. Field of the Invention

The present invention relates to a semiconductor integrated circuit and a control method thereof, and more specifically, to a semiconductor integrated circuit provided with a circuit for saving and recovering an internal state and a control method thereof.

2. Description of Related Art

Semiconductor integrated circuits provided with a low power consumption function such as a standby function and a resume function have attracted attention in recent years. In the stop of power supply, the internal node data of a semiconductor integrated circuit is generally deleted excluding a data stored in a nonvolatile memory. Accordingly, the internal node data needs to be set in the semiconductor integrated circuit in order to restart an operation from a state immediately before the stop of the power supply, upon the restart of the power supply.

According to Japanese Laid Open Patent Application (JP-A-Heisei 6-52070), an integrated circuit is disclosed in which the internal node data held by registers in the integrated circuit is saved in an external memory when the power supply is stopped. This integrated circuit includes the registers, a data saving unit, and a data recovering unit. The registers are connected to form a scan chain, the data saving unit makes the registers to form the scan chain in response to an external signal in a data saving mode such that the data held the registers are outputted to an external unit via the formed scan chain. At this time, the data saving unit serial/parallel-converts the internal node data into a data of a predetermined bit width and stores in a memory through a data input/output unit. The data recovering unit makes the registers to form the scan chain in response to an external signal in a data recovering mode, and recovers the saved data into the original registers via the formed scan chain. At this time, the data recovering unit uses a data input/output section to convert the internal node data read out from the memory, where the data with a predetermined bit width is converted into serial internal node data, which is returned through the scan chains.

Moreover, according to Japanese Laid Open Patent application (JP-P-2004-164647A), a data processing apparatus is disclosed which is provided with a circuit having one or more nodes, a memory, a system bus, and a state storage controller. The circuit is used for data processing, and stores one or more data values to define a state of the circuit entirely. The memory stores data. The system bus is connected to the circuit and the memory, and transfers multi-bit data words between the circuit and the memory in response to a memory transfer request given to the system bus during a normal operation to the circuit and the memory. The state storage controller is connected to the circuit and the system bus, and sequences of memory write requests are generated on the system bus in response to storage triggers by reading data values to define a state of the circuit from the one or the plurality of the nodes, and one or a plurality of state storage multi-bit data languages to express the data values is written in the memory, so that a state of the circuit can be retrieved by using the one or the plurality of the state storage multi-bit data languages. As related techniques, there is a technique described in U.S. patent application No. 2005/0149799.

Moreover, according to Japanese Laid Open Patent application (JP-P-2002-196846A), a technique is described for facilitating a saving operation of data which is not mapped into an address of a CPU. The CPU performs a simple switching process without a special switching process to achieve saving and recovery of the data. An LSI chip is divided into two regions of a main power supply region and a backup power supply An internal state in semiconductor integrated circuits is thus saved and retrieved by using the scan chains so that functions such as standby and resume can be realized. However, when the scan chains are operated, entire flip-flops to compose the scan chains are supposed to have simultaneous shift operations. In normal operations, only about a half to one third of a clock signal is supplied to built-in flip-flops by clock signal gating, where the flip-flops are controlled so as not to perform unnecessary operations. Accordingly, if a clock signal is supplied to the entire flip-flops which thereby operate simultaneously, a rapid current flow causes generation of a so-called IR drop which mean a voltage decrease by a resistive component of wiring, leaving a possibility of malfunctions.

SUMMARY OF THE INVENTION

The present invention provides a semiconductor integrated circuit and a control method thereof in which a data indicating an internal state is saved and recovered by using a scan chain without causing malfunctions due to an IR drop.

In a first embodiment of the present invention, a semiconductor integrated circuit includes a target circuit configured to operate in a normal mode, to form a scan chain to serially transfer a test data through the scan chain, in a scan path test mode, and to form a plurality of sub scan chains to save an internal node data in a memory in a save mode; and a backup control circuit configured to supply to the target circuit, a system clock signal in the normal mode, a test clock signal in the scan path test mode, and a save/recover clock signal in the save mode, and to control the target circuit and the memory such operations in the normal mode, the scan path test mode, and the save mode are performed, Also, in a second embodiment of the present invention, a control method of a semiconductor integrated circuit, is achieved by forming a shift register in a target circuit, as a scan chain, the shift register performing a shift operation in synchronization with a test clock signal, and performing a scan path test of the target circuit by shifting a test data in the shift register, in a scan path test mode; by performing a normal operation of the target circuit in response to a system clock signal in a normal mode; by storing an internal node data of a plurality of sub scan chains of the target circuit in a memory in response to a save/recover clock signal in a save mode; and by setting the internal node data in the plurality of sub scan chains of the target circuit again in response to the save/recover clock signal by reading out the internal node data from the memory, in a recover mode.

The test clock signal is slower than the system clock signal, and the save/recover clock signal is slower than the system clock signal and faster than the test clock signal.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Figure 1:
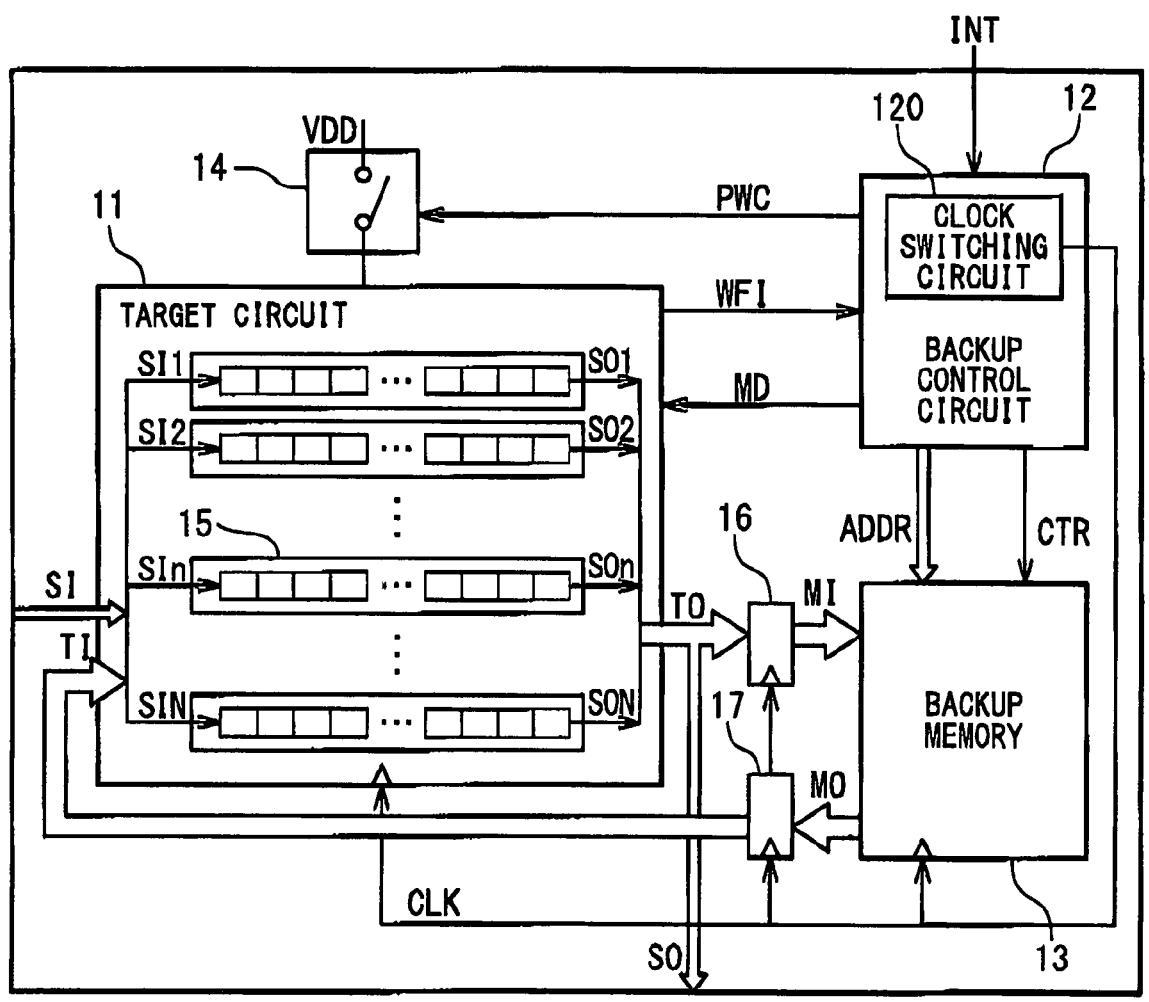
FIG. 1 is a block diagram showing a configuration of a semiconductor integrated circuit according to an embodiment of the present invention.

Hereinafter, a semiconductor integrated circuit of the present invention will be described in detail with reference to the attached drawings. FIG. 1 is a block diagram showing a configuration of the semiconductor integrated circuit according to an embodiment of the present invention. The semiconductor integrated circuit includes a target circuit 11 whose internal state is saved to an external unit, a backup memory 13 for storing the internal state of the target circuit 11, a backup control circuit 12 for controlling saving/recovering operations of a data indicating the internal state of the target circuit 11, a switch 14 for controlling a power supply of the target circuit 11, and register groups of flip-flops 16 and 17 disposed between the target circuit 11 and the backup memory 13. The internal state of the target circuit 11 is exemplified by internal node data held by flip-flops, which exist inside the target circuit 11.

The target circuit 11 is a circuit portion having an internal state to be held in a normal mode. The target circuit 11 builds therein a circuit for a scan path test, which is implemented to detect a manufacturing defect or the like of the target circuit 11. In a scan path test mode, flip-flops existing inside the target circuit 11 are connected to form a scan chain which functions as a shift register. At least one scan chain 15 as described above is provided inside the target circuit 11, The number of scan chains provided in recent semiconductor integrated circuits is about 32 in many cases, and more scan chains may be set or it may also be only one scan chain. In each of the scan chains 15, serial data for the scan path test is inputted from a scan input SI (i.e. SI1 to SIn to SIN) which is connected to an external unit, and a resultant data of the scan path test is serially outputted from a scan output SO (i.e. SO1 to SOn to SON) which is connected to an external unit. Synchronization is not required to input/output each of the serial data, and each of the scan chains may also be operated independently. The scan chain 15 will be described below as an example of circuits having the scan input SIn and the scan output SOn (n=1, 2, . . . , N).

The backup control circuit 12 switches an operation mode (MD) of the target circuit 11 between the normal mode, the scan chain test mode, a saving mode and a recovering mode in response to an instruction (WFI) from the target circuit 11. The backup control circuit 12 saves data indicating an internal state of the target circuit 11, i.e., an internal node data into the backup memory 13 in the saving mode. The backup control circuit 12 also sets the internal node data stored in the backup memory 13 to each node of the target circuit 11 in response to an interrupt signal (INT) from an external unit in the recovering mode, in order to recover the internal state of the target circuit 11. In the saving/recovering operations of the internal state, the backup control circuit 12 controls a storage address (ADDR) and write/read timing (CTR) of the backup memory 13. The backup control circuit 12 is also provided with a clock switching circuit 120 to switch a clock signal CLK which is supplied to the scan chains when saving and recovering the internal node data. In addition, the backup control circuit 12 has a controller therein, and the controller outputs a selection signal SLC and a scan effective signal SE to be described later, in response to an instruction WFI from the target circuit 11.

Figure 4:
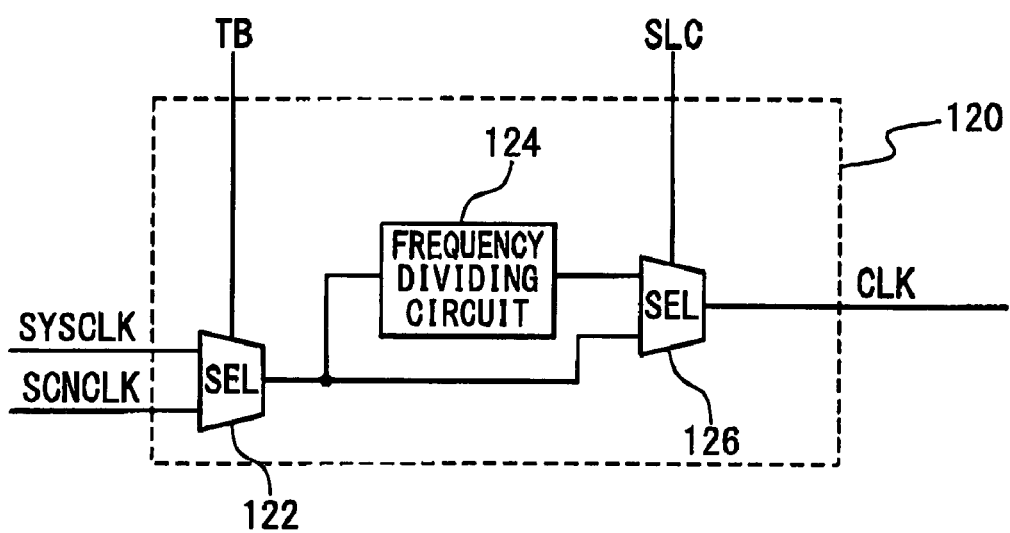
FIG. 4 is a block diagram showing a configuration of a clock switching circuit of the semiconductor integrated circuit in the present invention.

The clock switching circuit 120 is provided with a frequency dividing circuit 124 and selector circuits 122 and 126, as shown in FIG. 4. A system clock signal SYSCLK and a test clock signal SCNCLK are supplied to the selector circuit 122, which outputs one of the clock signals to the frequency dividing circuit 124 and the selector circuit 126 on the basis of a selection signal TB. The frequency dividing circuit 124 frequency-divides the clock signals into ½ times and ¼ times. The frequency-divided clock signal outputted from the frequency dividing circuit 124 and a clock signal outputted from the selector circuit 122 prior to the frequency division are supplied to the selector circuit 126 which outputs one of the signals as the clock signal CLK on the basis of a selection signal SLC. When saving/recovering the internal state of the target circuit 11, the frequency-divided clock signal is supplied to each of the flip-flops as a saving/recovering clock signal so that effects of IR drops can be suppressed. When the internal state of the target circuit 11 is saved/recovered, it is possible to suppress the influence of the IR drop by supplying the frequency-divided clock signal to the each of flip-flop as a saving/recovering clock signal. The test clock signal is supplied from an external unit and is slower than that of the system clock signal, which is used for control inside the semiconductor integrated circuit. The saving/recovering clock signal is faster than that of the test clock signal, so that the internal node data can be saved and recovered in a short period of time.

The frequency dividing circuit 124 is set to have a frequency division number which is compatible with circuit operations inside a chip. Although the frequency dividing circuit 124 is interposed between the selector circuit 122 and the selector circuit 126, the frequency dividing circuit 124 may be disposed in the front of the selector circuit 122. The clock switching circuit 120 may only be able to supply the clock signal CLK to the respective flip-flops by switching the clock signals among the system clock signal SYSCLK in the normal mode, the test clock signal SCNCLK in the scan path test mode, and the saving/recovering clock signal in the saving/recovering mode.

Figure 8:
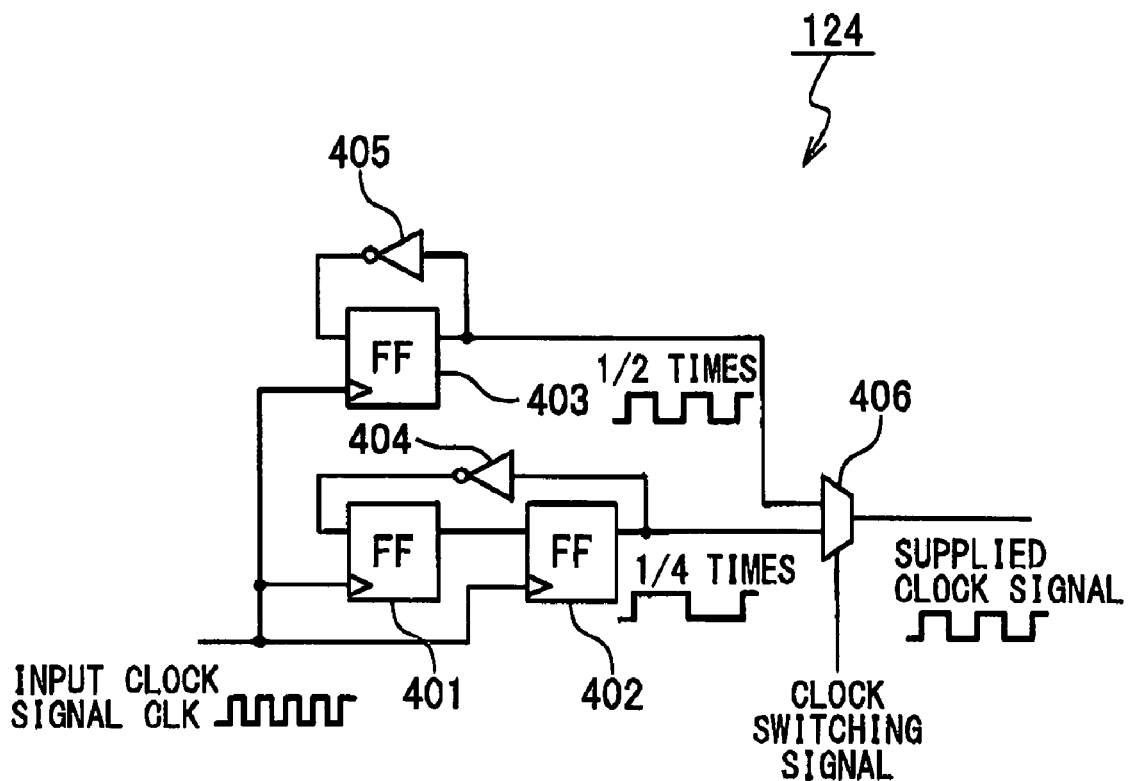
FIG. 8 is a block diagram showing a configuration of a frequency dividing circuit in the semiconductor integrated circuit of the present invention.

FIG. 8 is an example of the configuration of the frequency dividing circuit 124. The frequency dividing circuit 124 shown in FIG. 8 is composed of a F/F 401 which acquires an input signal in synchronization with the input CLK, a F/F 402 which receives the output signal of the F/F 401 as an input signal, and acquires the input signal in synchronization with input CLK in a same way, a F/F 403 which has a same function as those of the F/F 401 and F/F 402 and is connected in parallel to the F/F 401 and F/F 402 and F/F 403. Also, the output signal of the F/F 402 is received as the input signal of F/F 401 through an inverter 404. On the other hand, the output signal of the F/F 403 is received as the input signal of the F/F 403 through an inverter 405.

Initial values of the input signals of the F/F 401 and F/F 403 are 0, for example, and can set as the initial values of the input signals of the F/F 401 and F/F 403 0 by resetting a system reset by the external control. Here, the input CLK is a high-speed system clock SYSCLK as shown in FIG. 4. An F/F 402 that is connected with the F/F 401 and F/F 401 in series outputs the clock obtained by frequency-dividing the clock SYSCLK to ¼. On the other hand, the F/F 403 outputs a clock obtained by frequency-dividing the SYSCLK into ½. The frequency dividing circuit 124 has a selector 406, which receives one of the output signal of the F/F 402 and the output signal of the F/F 403. It should be noted that the frequency dividing circuit 124 shown in FIG. 8 generates a clock by frequency-dividing the SYSCLK as the input CLK into ½ or ¼, and outputs either of the generated clocks. However, the configuration of the frequency dividing circuit 124 is not limited to this configuration. For example, frequency dividing circuit 124 may have a signal path in which three or more F/F are connected, and outputs a clock obtained by frequency-dividing the SYSCLK into ⅛ times or less.

Figure 9:
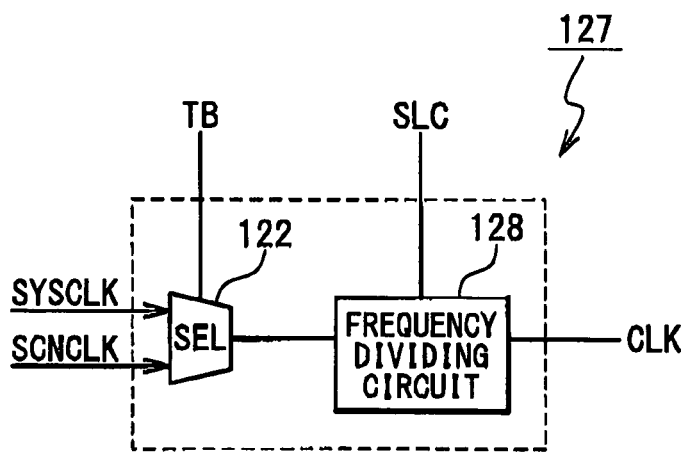
FIG. 9 is a block diagram showing another configuration of the clock switching circuit in the semiconductor integrated circuit of the present invention.
Figure 10:
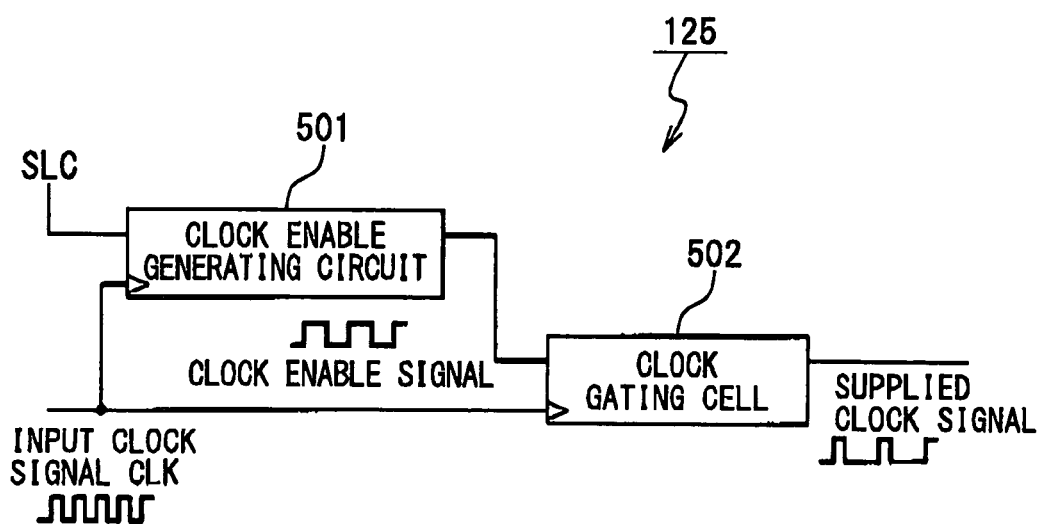
FIG. 10 is a block diagram showing another configuration of the frequency dividing circuit in the semiconductor integrated circuit of the present invention.

Also, it is possible to use the clock switching circuit 127 shown in FIG. 9 instead of the circuit shown in FIG. 4 and a frequency dividing circuit 128 shown in FIG. 10. In the clock switching circuit 127 shown in FIG. 9, the system clock signal SYSCLK is selected as the selection signal TB when the target circuit 11 shown in FIG. 1 performs a normal operation and the saving/recovering operation, and the test clock signal SCNCLK is selected as the selection signal TB when the scan path test operation is performed on the target circuit 11. On the other hand, the frequency dividing circuit 128 outputs the received clock signal based on the selection signal SLC just as it is, when the target circuit 11 carries out the normal operation and the scan path test operation, and the frequency dividing circuit 128 frequency-divides the received clock signal based on the selection signal SLC, when the saving/recovering operation is performed to the target circuit 11. In the clock switching circuit 127 shown in FIG. 9, the selector 126 of the clock switching circuit 120 shown in FIG. 4 is unnecessary. FIG. 10 is an example of configuration of the frequency dividing circuit 128. The frequency dividing circuit 128 shown in FIG. 10 is composed of a clock enable generating circuit 501 for receiving the selection signal SLC and the input clock signal CLK as an input signal, and a clock gating cell 502 for receiving the clock enable signal as the output signal of the clock enable generating circuit 501 and the input clock signal CLK. Here, the input clock signal CLK is either of the system clock signal SYSCLK or the test clock signal SCNCLK. The clock enable generating circuit 501 operates based on the selection signal SLC. When the target circuit 11 performs the saving/recovering operation, the clock enable generating circuit 501 frequency-divides the received clock signal CLK in response to the selection signal SLC and outputs the frequency-divided clock signal to the clock gating cell 502. The clock enable generating circuit 501 has a circuit for generating an enable signal. For example, the clock enable generating circuit generates the enable signal in the ON state for every three cycles of the received clock signal. Thus, the ⅓ frequency-divided clock signal can be outputted. Although the present invention is not limited, the clock enable generating circuit 502 may be composed to be described below.

First, the clock enable generating circuit 501 has a counter therein. This counter changes the count value in such a manner as 0→1→2→0→1→2, for every rising edge of the received clock signal by the clock enable generating circuit 501. The clock enable generating circuit 501 outputs the enable signal in the ON state every time the count value of the counter goes to "0". On the other hand, the clock gating cell 502 is a circuit for outputting the input clock signal CLK just as it is in case that the received enable signal is in the ON state. Therefore, the output of the frequency dividing circuit 128 shown in FIG. 10 is the frequency-divided clock signal CLK. On the other hand, the clock enable generating circuit 501 outputs the enable signal with a predetermined level, i.e., always in the ON state in response to the selection signal SLC when the target circuit performs the normal operation or the scan path test operation. In this case, the clock gating cell 502 outputs the input clock signal CLK just as it is. Here, the ON state of the enable signal indicates a period during which the enable signal is in a high level, which does not limit the present invention.

The target circuit 11 has a power supply system, which is separated from the remaining circuits. Accordingly, the power for the target circuit 11 can be only turned off. A switch 14 turns on and off the power supply on the basis of control (PWC) of the backup control circuit 12.

The register groups 16 and 17 are also called a register slice, and are latch registers having a width equal to a data width of the backup memory 13 (to be referred to as the register groups 16 and 17 hereinafter). The register group 16 temporarily holds an internal node data TO outputted from the target circuit 11 on the basis of the supplied clock signal CLK to output to the backup memory 13 as a saved data MI. The register group 17 temporarily holds a saved data MO outputted from the backup memory 13 on the basis of the supplied clock signal CLK to output to the target circuit 11 as an internal node data TI. Either the register group 16 or 17 may be used.

The backup memory 13 holds the internal node data indicating the internal state of the target circuit 11. The backup memory 13 is sufficient to have a capacity to store the internal node data of the target circuit 11. The backup memory 13 has a data width (or word length) sufficient to effectively acquire the internal node data. For example, if each of the scan chains of 32 lines is divided into sub scan chains of four lines and the internal node data TO is extracted from the four places, 128-bit data is outputted in parallel for every one scan clock signal. In this case, the backup memory 13 needs to have a word length equal to or longer than 128 bits. A write/read operation timing CTR and an address ADDR of the backup memory 13 are provided from the backup control circuit 12. The backup memory 13 is set to have a high threshold voltage, and used as a memory with a low leakage current. Accordingly, the backup memory 13 whose speed is not so fast has low power consumption. If a nonvolatile memory such as a flash memory is used as the backup memory 13, a power supply to the backup memory 13 can be turned off in standby, allowing further reduction of power consumption.

The internal node data indicating the internal state of the target circuit 11 is inputted and outputted via the scan chain 15. The scan chain 15 is used for the scan path test on normality of the semiconductor integrated circuit, and shift operations are performed on the basis of the supplied clock signal CLK. In the scan path test, a test data is supplied from the scan input SI in the scan chain 15 and a test result is outputted from the scan output SO. Although being not described here, the backup control circuit 12 and the backup memory 13 may be subjected to the scan path test.

When an internal logic circuit is operated in the target circuit 11, an operation state thereof is held by sequential circuits, i.e. flip-flops, included in the logic circuit. That is, the flip-flops hold the internal state of the target circuit 11. The internal state of the target circuit 11 can be outputted to an external unit by saving the internal node data held by the flip-flops, and the internal state of the target circuit 11 can be set by setting the data in each of the flip-flops. On the other hand, the flip-flops form the scan chain 15 in the scan path test, and the data held by the flip-flops can be serially outputted. In the scan chain 15, data can also be serially inputted to allow data setting for the scan path test in each of the flip-flops. Accordingly, the states of the flip-flops can be read and written by using the scan chain 15.

In the target circuit 11, an output of the scan chain 15, i.e. outputting to the backup memory 13 the scan output SO and the data TO which was extracted from a plurality of locations in the middle of the scan chain 15, are made on the basis of control of the backup control circuit 12. When data held by the entire flip-flops of the target circuit 11 is outputted, it is assumed that an internal state of the target circuit 11 was saved in the backup memory 13. The target circuit 11 also captures the data TI outputted from the backup memory 13 to set in the scan chains 15 on the basis of control of the backup control circuit 12. When the data is set in the scan chain 15, it is assumed that the internal state of the target circuit 11 is read. When the target circuit 11 is switched from a read state to a normal operation state, the target circuit 11 is returned to the normal operation state.

Figure 2:
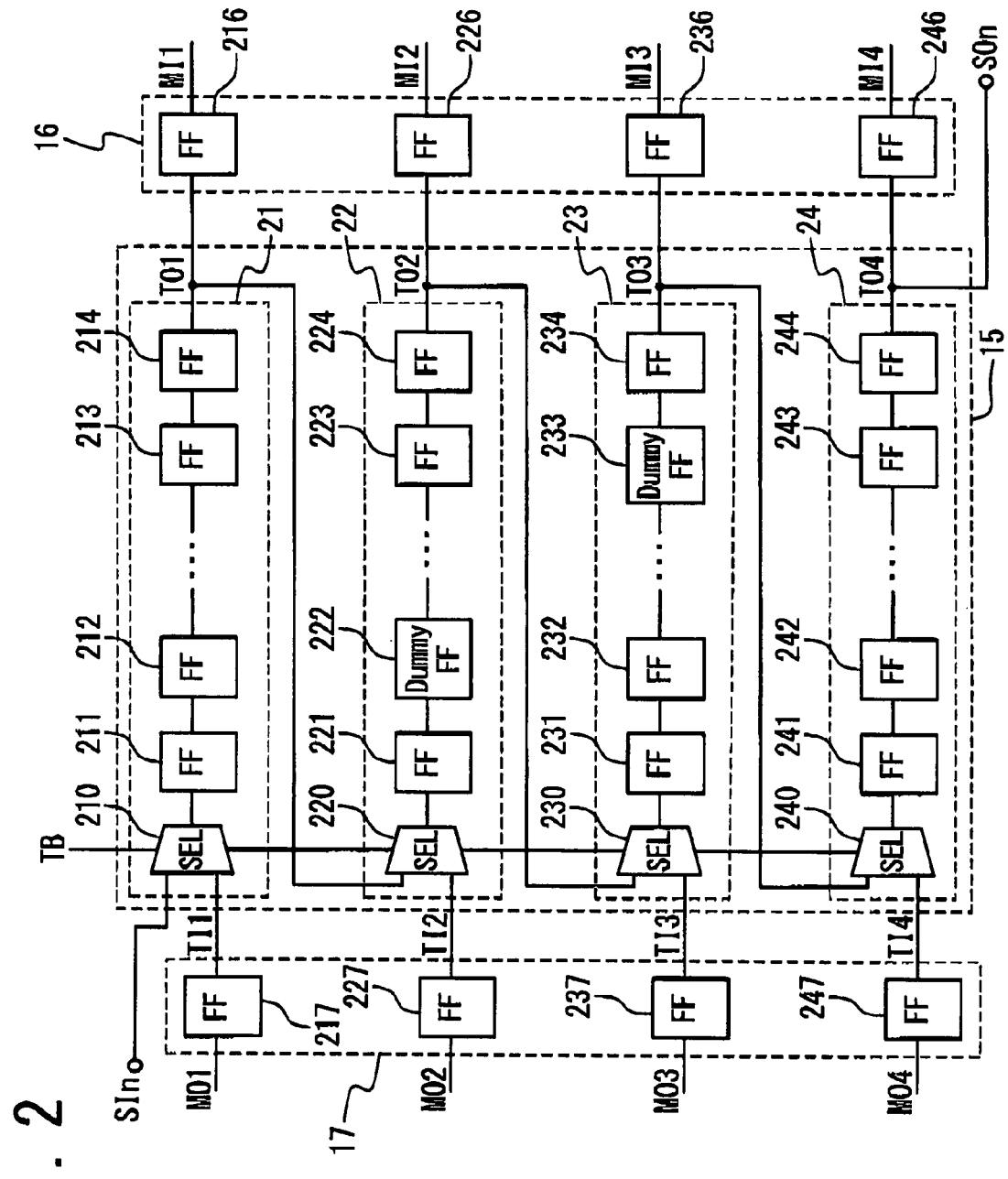
FIG. 2 is a block diagram showing a configuration of a scan chain of the semiconductor integrated circuit in the present invention.

FIG. 2 shows a configuration of the scan chain 15 when the scan chain is effective. The scan chain 15 is a chain of a single line composed of a plurality of registers to be connected in the scan test. This single-line chain is divided into a plurality of sub scan chains to operate when saving the internal node data into the backup memory 13 and reading the internal node data form the backup memory 13. Accordingly, the scan chain 15 is provided with the plurality of the sub scan chains. The scan chain 15 here is provided with four of cascade-connected sub scan chains 21, 22, 23 and 24. Moreover, the register group 17 including flip-flops 217, 227, 237 and 247 is connected to an input side of the sub scan chains 21 to 24, while the register group 16 including flip-flops 216, 226, 236 and 246 is connected to an output side thereof.

Each of the sub scan chains 21, 22, 23 and 24 includes the same number of flip-flops. If the number of the flip-flops is not consistent, a dummy flip-flop supplied with no clock signal by clock gating is inserted in the normal operation. In a case of FIG. 2, a flip-flop 222 is inserted in the sub scan chain 22 as a dumpy flip-flop and a flip-flop 233 is inserted in the sub scan chain 23 as a dumpy flip-flop, so that each of the sub scan chains has an identical length.

The sub scan chains 21 to 24 operate in parallel in the input/output of the internal node data for simultaneous data input/output. The sub scan chain 21 is provided with a selector circuit 210 and flip-flops 211 to 214 as an entity of the scan chain. Similarly, the sub scan chain 22 is provided with a selector circuit 220 and flip-flops 221 to 224, the sub scan chain 23 is provided with a selector circuit 230 and flip-flops 231 to 234, and the sub scan chain 24 is provided with a selector circuit 240 and flip-flops 241 to 244. In the selector circuits 210, 220, 230 and 240, a signal is selected from two input signals and outputted on the basis of the selection signal TB.

Figure 3:
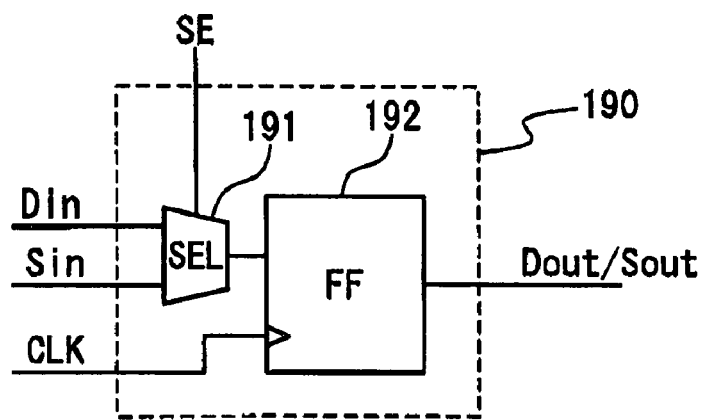
FIG. 3 is a diagram showing an example of a scan flip-flop in the semiconductor integrated circuit in the present invention.

Each of the flip-flops 211 to 214, 221 to 224, 231 to 234 and 241 to 244 is a multiplexed scan flip-flop which is provided with a flip-flop main body 192 and a selector circuit 191, as shown in FIG. 3. A data input Din outputted from a logic circuit in the normal operation and a scan chain input Sin outputted from the front stage of the scan chain are supplied to the selector circuit 191 which selects one of the two inputs and outputs to the flip-flop main body 192 on the basis of a scan effective signal SE. Although description will be given below on the assumption that the flip-flops are multiplexed scan flip-flops, scan flip-flops of another type can be obviously applied in the present invention.

In the sub scan chain 21, a scan input SIn and an internal node data TI1 are supplied to the selector circuit 210. The scan input SIn is supplied from an external unit, and the internal node data TI1 stored in the backup memory 13 is outputted therefrom and supplied via the flip-flop 217 of the register group 17. The selector circuit 210 selects and outputs the data supplied from the scan input SIn in the scan path test, and selects and outputs the internal node data TI1 stored in the memory 13 when saving and recovering the internal state, on the basis of the selection signal TB. The flip-flops 211 to 214 are connected in a chain form to produce a shift register to which the output signal of the selector circuit 210 is supplied. The output of the flip-flop 214 is outputted as an internal node data TO1 and sent to the sub scan chain 22 in the subsequent stage.

In the sub scan chain 22, the output data TO1 of the sub scan chain 21 in the front stage and an internal node data TI2 are supplied to the selector circuit 220. The internal node data TI2 stored in the backup memory 13 is outputted therefrom and supplied via the flip-flop 227 of the register group 17. The selector circuit 220 selects and outputs the output data TO1 of the front stage in the scan path test, and selects and outputs the internal node data TI2 stored in the memory 13 when saving and recovering the internals state, on the basis of the selection signal TB. The flip-flops 221 to 224 are connected in a chain form to produce a shift register to which the output signal of the selector circuit 220 is supplied. The output of the flip-flop 224 is outputted as an internal node data TO2 and sent to the sub scan chain 23 in the subsequent stage.

Similarly, in the sub scan chain 23, the output data TO2 of the sub scan chain 22 in the front stage and an internal node data TI3 are supplied to the selector circuit 230. The internal node data TI3 stored in the backup memory 13 is outputted therefrom and supplied via the flip-flop 237 of the register group 17. The selector circuit 230 selects and outputs the output data TO2 of the front stage in the scan path test, and selects and outputs the internal node data TI3 stored in the memory 13 when saving and recovering the internals state, on the basis of the selection signal TB. The flip-flops 231 to 234 are connected in a chain form to produce a shift register to which the output signal of the selector circuit 230 is supplied. The output of the flip-flop 234 is outputted as an internal node data TO3 and sent to the sub scan chain 24 in the subsequent stage.

Similarly, in the sub scan chain 24, the output data TO3 of the sub scan chain 23 in the front stage and an internal node data TI4 are supplied to the selector circuit 240. The internal node data TI4 stored in the backup memory 13 is outputted therefrom and supplied via the flip-flop 247 of the register group 17. The selector circuit 240 selects and outputs the output data TO3 of the front stage in the scan path test, and selects and outputs the internal node data TI4 stored in the memory 13 when saving and recovering the internals state, on the basis of the selection signal TB. The flip-flops 241 to 244 are connected in a chain form to produce a shift register to which the output signal of the selector circuit 240 is supplied. The output of the flip-flop 244 is outputted as an internal node data TO4 and sent to the outside as the output SOn of the scan chain 15.

Next, an operation of the scan chain 15 will be described. In the original function operation of the target circuit 11, the internal state, i.e., an internal node data of the target circuit 11 is held by the flip-flops 211 to 214, the flip-flops 221 to 224, the flip-flops 231 to 234, and the flip-flops 241 to 244 as registers of the internal logic circuit.

In the scan path test, the flip-flops existing inside the target circuit 11 are connected to form the scan chain 15, as shown in FIG. 2. Since the scan chain is well known, the detailed description thereof will be omitted. When the scan effective signal SE instructs to form the scan chain, the selector circuit 191 in each of the flip-flops is set to select the scan chain signal Sin.

The selector circuits 210, 220, 230 and 240 are set to select and output data on a scan data side by the selection signal TB. Accordingly, a single shift register is formed by connecting the flip-flops included in the sub scan chains 21 to 24. A scan data is supplied from the scan input SIn in synchronization with a scan clock signal and shifted through the flip-flops sequentially toward the scan output SOn. When the scan data is set in the entire flip-flops, each of the flip-flops is temporarily released from a configuration of the scan chain 15, and data of the target circuit 11 as the original internal logic circuit is taken into. At this time, each of the flip-flops outputs the scan data and thereby each of the flip-flops is supposed to hold a result of the scan path test. Then, each of the flip-flops is returned to a configuration of the scan chain 15. The shift register which holds the result of the scan path test outputs the resultant data of the scan path test from the scan output SOn in response to the scan clock signal.

In case of saving the internal node data, the scan chain 15 is set so that the sub scan chains 21 to 24 function in parallel. The selection signal TB is set to select the data TI, i.e., the output of the backup memory 13. In the same manner with the scan path test, the internal node data held by the flip-flops are temporarily held in parallel by the register 216 as the output data TO1 to TO4 of the sub scan chains, in synchronization with the clock signal and sequentially outputted to the backup memory 13. Timing to store the output data in the backup memory 13 is delayed by one clock because of being temporarily held by the register 216. However, since the output of the register group 16 does not substantially change during one clock, a time margin is generated in the setting the storage timing in the backup memory 13. Accordingly, this is effective when the wiring from an output position of the sub scan chains 21 to 24 to the backup memory 13 is long.

The address ADDR of the backup memory 13 is updated by the backup control circuit 12 in synchronization with the clock signal, and the output data TO1 to TO4 of the sub scan chains are subsequently stored in the backup memory 13. If the data is outputted for the number of flip-flops included in the sub scan chains, the internal node data included in the scan chain 15 is supposed to be entirely outputted to the backup memory 13. Accordingly, an output time can be shortened more than a case that the output SOn of the scan chain 15 is connected to a memory to store the internal node data. As shown in FIG. 2, if the scan chain 15 is divided into four pieces as shown as the sub scan chains 21 to 24, the output time is reduced to one fourth.

In case of recovering the internal node data, i.e., in case of setting into the original flip-flops, the internal node data stored in the backup memory 13, the scan chain 15 is set in such a manner that the sub scan chains 21 to 24 function in parallel. The selection signal TB is set to select the data TI, i.e., the output of the backup memory 13. The internal node data TI1 to TI4 are supplied from the backup memory 13 to the sub scan chains 21 to 24 via the register group 17. Timing to set the data in the scan chain 15 is delayed by one clock because the outputs of the backup memory 13 are temporarily held by the register group 17. However, considering a propagation delay from the backup memory 13 to the selector circuits 210, 220, 230 and 240 and an access time to the backup memory 13, insertion of the register group 17 provides a timing margin. Accordingly, a degree of positional freedom is improved in disposing the backup memory 13 on the chip.

The backup control circuit 12 updates the address ADDR of the backup memory 13 from an initial setting value for every clock, and controls such that the internal node data T1 to 4 are supplied to the sub scan chains 21 to 24 in the order of being saved. The internal node data TI1 to TI4 supplied to the sub scan chains 21 to 24 pass through the selector circuits 210, 220, 230 and 240, and are shifted through the shift registers formed in the sub scan chains toward the outputs TO1 to TO4. When the internal node data TI1 to TI4 are shifted for the number of the flip-flops included in the sub scan chains, the original internal node data is set in each of the flip-flops. This means that the internal state of the target circuit 11 has been recovered. Thereafter, the backup recovering mode is canceled and the target circuit 11 returns to the normal operation.

Each of the flip-flops in the target circuit 11 operates in synchronization with the system clock signal SYSCLK in the normal operation, and operates in synchronization with the test clock signal SCNSLK supplied from an external unit in the scan path test operation. The test clock signal SCNCLK is slower (i.e. a clock signal frequency is lower) than the normal system clock signal because of being accompanied by input/output of signals from/to the outside of the semiconductor integrated circuit. When the above scan chain is used to save/recover the internal state, it is preferable to use the system clock signal SYSCLK in order to shorten an operation time thereof. However, the clock signal for the saving/recovering operation of the internal state is used due to a possibility of malfunction caused by effect of IR drop. The clock signal for the saving/recovering operation of the internal state is generated on the basis of the system clock signal SYSCLK by the clock switching circuit 120.

Figure 5:
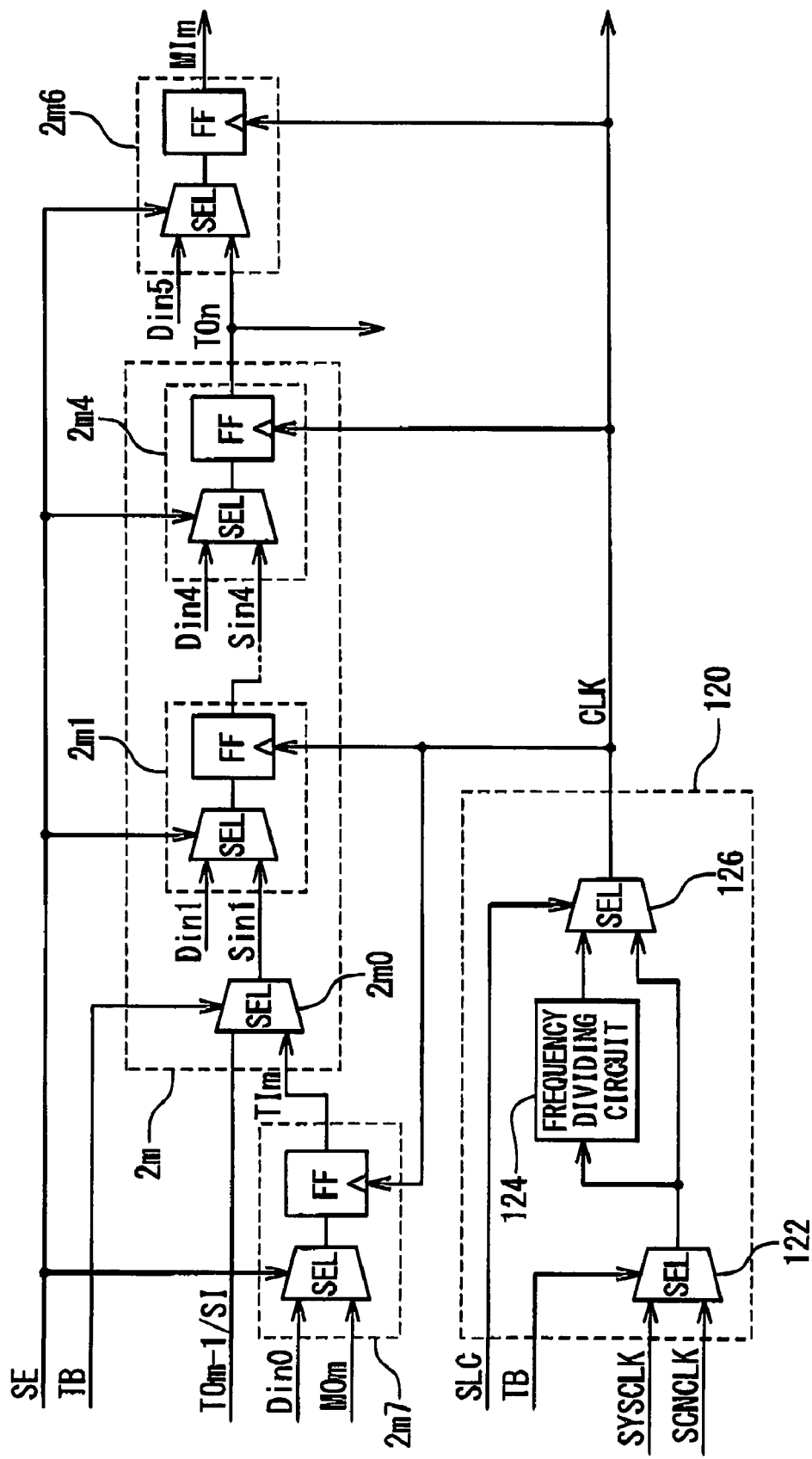
FIG. 5 is a diagram to explain operations of the semiconductor integrated circuit in the present invention.

Referring to FIG. 5, the selection of a signal by the selector circuit in respective operation modes will be described. FIG. 5 shows the selector circuits 122 and 126 and the frequency dividing circuit 124 which are all included in the clock switching circuit 120, a selector circuit 2m0 and flip-flops 2m1 to 2m4 which are all included in a sub scan chain 2m of the scan chain 15, a flip-flop 2m6 of the register 16, and a flip-flop 2m7 of the register group 17. It should be noted that the signal selection by the selection circuit will be described by using as an example, a case that the clock switching circuit 120 is used. However, even in case of the clock switching circuit 127 shown in FIG. 9, the signal selection by the selection circuits is similar.

In the normal operation, the backup control circuit 12 sets the scan path effective signal SE, the selection signal TB and the clock signal switching signal SLC so that the scan path effective signal SE indicates a scan path ineffective state, the selection signal TB indicates a non-test operation state, and the clock signal switching signal SLC indicates a non-frequency dividing state, respectively. The scan path effective signal SE becomes inactive and the scan chain is released. Accordingly, the flip-flops 2m1 to 2m4, 2m6, and 2m7 respectively select signals Din1 to Din4, Din 5 and Din0 which indicate data of the internal state. The selection signal TB indicates that it is not a test operation state and instructs the selector circuit 122 of the clock switching circuit 120 to select the system clock signal SYSCLK. The clock signal selection signal SLC instructs the selector circuit 126 to select the output of the selector circuit 122. Accordingly, the system clock signal SYSCLK is supplied to each of the flip-flops as the clock signal CLK. Although the selection signal TB is also supplied to the sub scan chain 2m, the selector circuit 2m0 to which the selection signal TB is supplied simply switches the scan path signal and has no effect in the normal operation. The target circuit 11 performs the normal operation in synchronization with the system clock signal SYSCLK.

In the test operation, the backup control circuit 12 set the scan path effective signal SE, the selection signal TB and the clock signal switching signal SLC so that the scan path effective signal SE indicates a scan path effective state, the selection signal TB indicates a test operation state, and the clock signal switching signal SLC indicates a non-frequency dividing state, respectively. The scan path effective signal SE becomes active and the scan chain is formed. Accordingly, the flip-flops 2m1 to 2m4, 2m6 and 2m7 respectively select and acquire signals Sin1 to Sin4, TOm and MOm to produce the scan chain. The selection signal TB indicates a test operation state and instructs the selector circuit 122 of the clock switching circuit 120 to select the test clock signal SCNCLK. The selection signal TB is also supplied to the selector circuit 2m0 of the sub scan chain 2m, and the selector circuit 2m0 is switched to select the output of the sub scan chain 2m−1 in the front stage or the scan chain input signal SI. The clock signal selection signal SLC instructs the selector circuit 126 to select the output of the selector circuit 122. Accordingly, the test clock signal SCNCLK is supplied to each of the flip-flops as the clock signal CLK. The target circuit 11 thus configures the scan chain in the test operation, and each of the flip-flops performs a shift operation in synchronization with the test clock signal SCNCLK supplied from an external unit.

In the saving/recovering operation, the backup control circuit 12 sets the scan path effective signal SE, the selection signal TB and the clock signal switching signal SLC so that the scan path effective signal SE indicates a scan path effective state, the selection signal TB indicates a non-test operation state, and the clock signal switching signal SLC indicates a frequency dividing state, respectively. The scan path effective signal SE becomes active and a scan chain is formed. Accordingly, the flip-flops 2m1 to 2m4, 2m6 and 2m7 respectively select and acquire the signals Sin1 to Sin4, TOm and MOm to form the scan chain. The selection signal TB indicates that it is not a test operation state and instructs the selector circuit 122 of the clock switching circuit 120 to select the system clock signal SYSCLK. The selection signal TB is also supplied to the selector circuit 2m0 of the sub scan chain 2m, and the selector circuit 2m0 is switched to select the output of the flip-flop 2m7. The clock signal selection signal SLC instructs the selector circuit 126 to select the output of the frequency dividing circuit 124. Accordingly, a clock signal obtained by frequency-dividing the system clock signal SYSCLK in the frequency dividing circuit 124 is supplied to each of the flip-flops as the clock signal CLK.

The scan chain is thus formed in the target circuit 11 in the saving/recovering operation, and each of the flip-flops perform a shift operation in synchronization with the clock signal obtained by frequency-dividing the system clock signal SYSCLK. That is, since the entire flip-flops operate on the basis of a slower clock signal, i.e. a clock signal with a longer period than the system clock signal SYSCLK in the shift operation, effects of IR drops are reduced so that malfunctions can be prevented.

Figure 6:
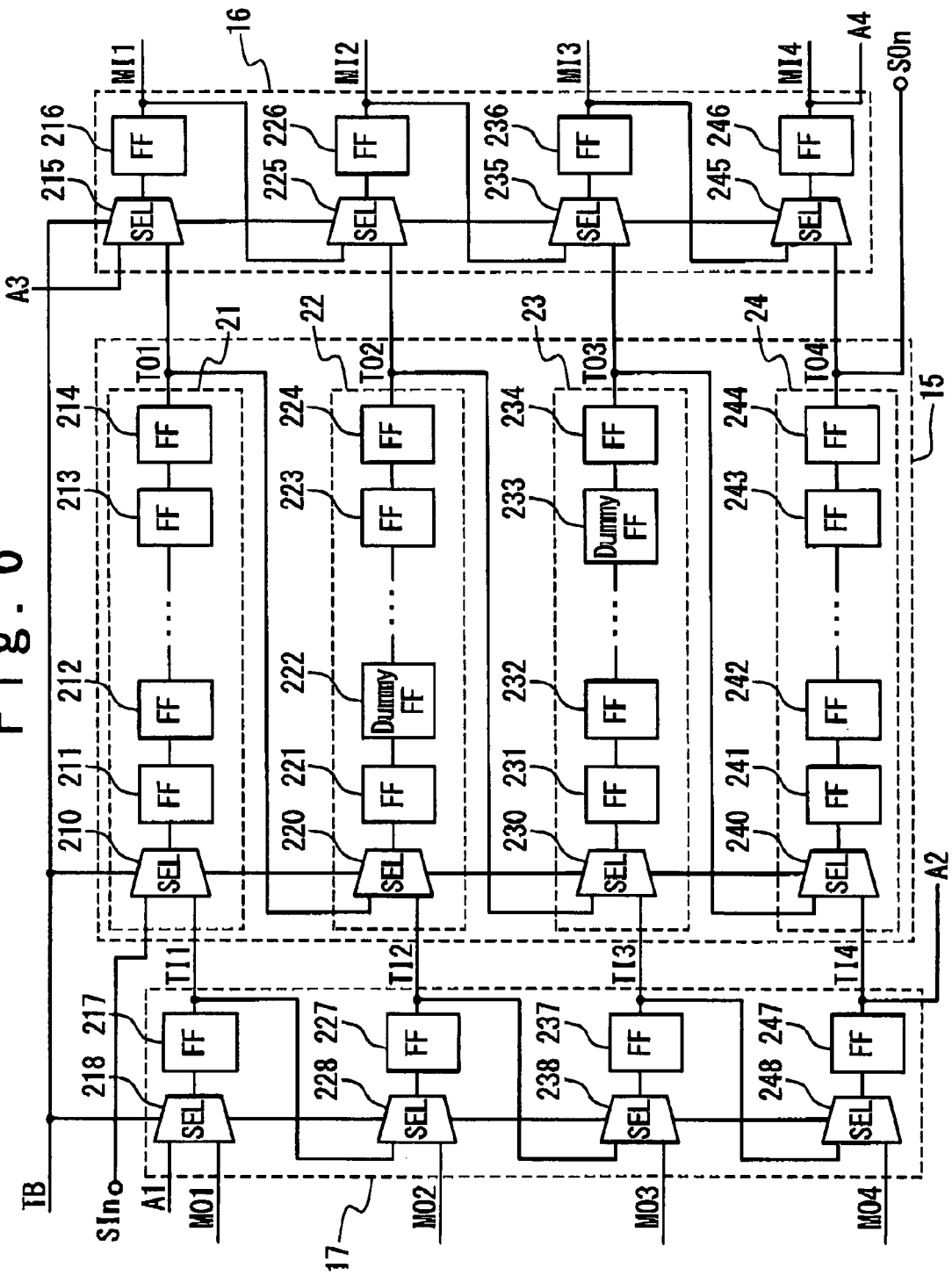
FIG. 6 is a block diagram showing another configuration of the scan chain in the semiconductor integrated circuit of the present invention.

Although the register groups 16 and 17 are described above as the group of flip-flops connected to the backup memory 13, they may be provided with selector circuits 2m5 (m=1, . . . , 4) and 2m8 (m=1, . . . , 4) as shown in FIG. 6. Providing the selector circuits 2m5 and 2m8 allows the scan path test in the register groups 16 and 17. At this time, the register groups 16 and 17 are also allowed to have sub scan chains formed by flip-flops of one stage. That is, the register group 17 having the selector circuit 218 and the flip-flop 217 is connected to an input side of the sub scan chain 21, and the register group 16 having the selector circuit 215 and the flip-flop 216 is connected to an output side of the sub scan chain 21. Similarly, the register groups 17 and 16 are connected to the inputs/outputs of the sub scan chains 22, 23 and 24.

In this case, data held by the flip-flops 216, 226, 236, 246, 217, 227, 237 and 247 included in the register groups 16 and 17 can also be stored in the backup memory 13, and data indicating an internal state held by the flip-flops can be saved/recovered. Although the register groups 16 and 17 are produced by the one-stage flip-flops, multiple-stage flip-flops may also be used.

Figure 7:
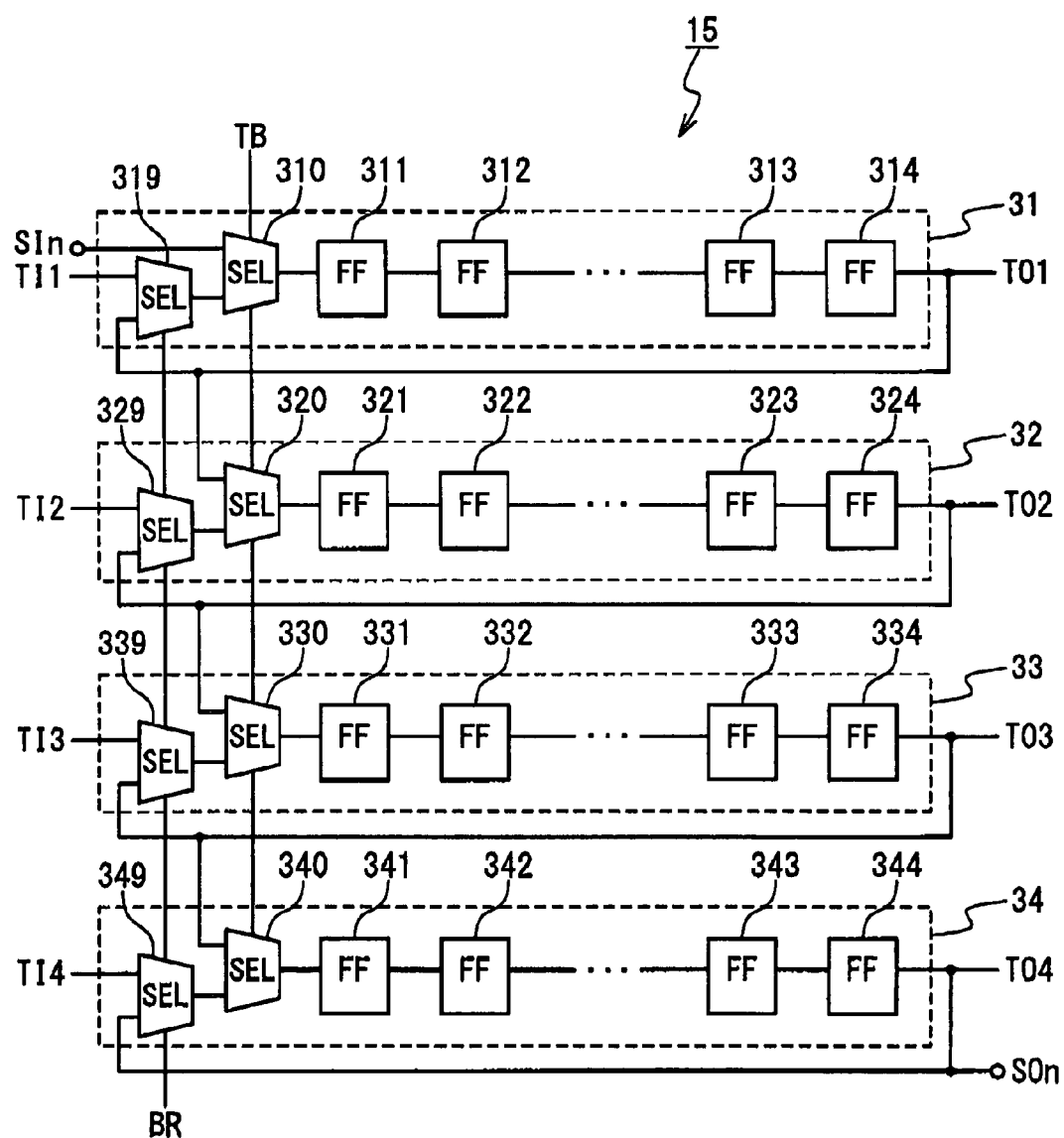
FIG. 7 is a block diagram showing further another configuration of the scan chain in the semiconductor integrated circuit of the present invention.

The scan chain 15 may also be connected so that the outputs of sub scan chains 31 to 34 are returned to inputs of the sub scan chains 31 to 34 themselves as shown in FIG. 7. Such a connection allows reduction of a minimum recovering time. The minimum recovering time refers to a time required to stop saving immediately after a start of saving the internal node data, i.e. a time required when instructing to recover the internal node data. The scan chain 15 shown in FIG. 7 has a selector circuit further provided at the forefront of each of the sub scan chains 21 to 24 shown in FIG. 2.

The sub scan chain 31 is provided with selector circuits 319 and 310 and flip-flops 311 to 314. Similarly, the sub scan chain 32 is provided with selector circuits 329 and 320 and flip-flops 321 to 324, the sub scan chain 33 is provided with selector circuits 339 and 330 and flip-flops 331 to 334, and the sub scan chain 34 is provided with selector circuits 349 and 340 and flip-flops 341 to 344. The configuration of the circuits other than the selector circuits 319, 329, 339 and 349 remains the same with that of the scan chain shown in FIG. 2.

The selector circuits 319, 329, 339 and 349 select either the saved internal node data TI outputted from the backup memory 13 or the internal node data TO outputted from the sub scan chains on the basis of the selection signal BR in order to output to the selector circuits 310, 320, 330 and 340.

In the sub scan chain 31, the internal node data TI1 supplied from the backup memory 13 and the internal node data TO1 outputted from the sub scan chain 31 are supplied to the selector circuit 319. The selector circuit 319 selects and outputs the internal node data TO1 to be fed back when saving the internal state, while selecting and outputting the saved internal node data TI1 when recovering the internal state, on the basis of the selection signal BR. The scan input SIn and the output signal of selector circuit 319 are supplied to the selector circuit 310. The selector circuit 310 selects and outputs the scan input signal SIn in the scan path test, while selecting and outputting the output signal of the selector circuit 319 when saving and recovering the internal state, on the basis of the selection signal TB. The flip-flops 311 to 314 are connected in the chain form to produce a shift register to which the output signal of the selector circuit 310 is supplied. The output signal of the flip-flop 314 is outputted as the internal node data TO1 and sent to the sub scan chain 32 in the subsequent stage.

In the sub scan chain 32, the internal node data TI2 supplied from the backup memory 13 and the internal node data TO2 outputted from the sub scan chain 32 are supplied to the selector circuit 329. The selector circuit 329 selects and outputs the internal node data TO2 so as to be fed back when saving the internal state, while selecting and outputting the saved internal state TI2 when recovering the internal state, on the basis of the selection signal BR. The output data TO1 of the sub scan chain 31 in the front stage and the output signal of selector circuit 329 are supplied to the selector circuit 320. The selector circuit 320 selects and outputs the output data TO1 of the front stage in the scan path test, while selecting and outputting the output signal of the selector circuit 329 when saving and recovering the internal state, on the basis of the selection signal TB. The flip-flops 321 to 324 are connected in a chain form to produce a shift register to which the output signal of the selector circuit 320 is supplied. The output signal of the flip-flop 324 is outputted as the internal node data TO2 and sent to the sub scan chain 33 in the subsequent stage.

Similarly, in the sub scan chain 33, the internal node data TI3 supplied from the backup memory 13 and the internal node data TO3 outputted from the sub scan chain 33 are supplied to the selector circuit 339. The selector circuit 339 selects and outputs the internal node data TO3 so as to be fed back when saving the internal state, while selecting and outputting the saved internal state TI3 when recovering the internal state, on the basis of the selection signal BR. The output data TO2 of the sub scan chain 32 in the front stage and the output data of selector circuit 339 are supplied to the selector circuit 330. The selector circuit 330 selects and outputs the output data TO2 of the front stage in the scan path test, while selecting and outputting the output signal of the selector circuit 339 when saving and recovering the internal state, on the basis of the selection signal TB. The flip-flops 331 to 334 are connected in a chain form to produce a shift register to which the output signal of the selector circuit 330 is supplied. The output of the flip-flop 334 is outputted as the internal node data TO3 and sent to the sub scan chain 34 in the subsequent stage.

Similarly, in the sub scan chain 34, the internal node data TI4 supplied from the backup memory 13 and the internal node data TO4 outputted from the sub scan chain 34 are supplied to the selector circuit 349. The selector circuit 349 selects and outputs the internal node data TO4 so as to be fed back when saving the internal state, while selecting and outputting the saved internal state TI4 when recovering the internal state, on the basis of the selection signal BR. The output data TO3 of the sub scan chain 33 in the front stage and the output data of selector circuit 349 are supplied to the selector circuit 340. The selector circuit 340 selects and outputs the output data TO3 of the front stage in the scan path test, while selecting and outputting the output signal of the selector circuit 349 when saving and recovering the internal state, on the basis of the selection signal TB. The flip-flops 341 to 344 are connected in a chain form to produce a shift register to which the output signal of the selector circuit 340 is supplied. The output of the flip-flop 344 is outputted as the internal node data TO4 and sent to the outside as the output SOn of the scan chain 15.

Each of the flip-flops returns to an original state again when the saving operation is completed. Therefore, in case of recovering the internal state due to certain factors in the middle of saving operation, completion of the saving operation is supposed to be completion of recovering. Accordingly, it is made possible to return to a normal operation immediately after completion of the recovering operations.

According to the present invention, it is possible to provide a semiconductor integrated device and a control method thereof where malfunctions caused by IR drops are not observed when operations to save and retrieve an internal state are performed by using scan chains.

Moreover, according to the present invention, it is possible to provide a semiconductor integrated device and a control method thereof where memories with a slow operation property are used as backup memories.

Furthermore, according to the present invention, it is possible to improve versatility in designing layout of a semiconductor integrated circuit which performs operations to save and retrieve an internal state by using scan chains. According to the present invention, power consumption of the semiconductor integrated circuit can also be reduced.

Although the invention has been described above in connection with several embodiments thereof, it will be appreciated by those skilled in the art that those embodiments are provided solely for illustrating the present invention, and should not be relied upon to construe the appended claims in a limiting sense.

What is claimed is:

1. A semiconductor integrated circuit, comprising:
   a memory;
   a target circuit forming a scan chain including at least one register and performing a normal operation and a saving operation, the target circuit saving a data stored in the register to the memory during the saving operation through the scan chain; and
   a clock switching circuit supplying a save/recover clock signal to the scan chain when the target circuit performs the saving operation, the save/recover clock signal being slower than a system clock signal being used for the normal operation,
   wherein the memory is configured to operate based on the save/recover clock signal.

2. The semiconductor integrated circuit according to claim 1, wherein the target circuit further performs a recovering operation, the target circuit rewriting the data saved in the memory into the register during the recovering operation, and
   wherein the clock switching circuit supplies the save/recover clock signal to the scan chain when the target circuit performs the recovering operation.

3. The semiconductor integrated circuit according to claim 2, wherein the clock switching circuit comprises a frequency dividing circuit generating the save/recover clock signal by performing frequency dividing of the system clock signal.

4. The semiconductor integrated circuit according to claim 3, wherein the frequency dividing circuit comprises a first circuit including:
   a flip-flop receiving and outputting an input signal based on the system clock signal; and
   a first inverter receiving a signal which the flip-flop has output, inverting a value of the received signal and inputting the inverted signal into the flip-flop.

5. The semiconductor integrated circuit according to claim 4, wherein the frequency dividing circuit further comprises a second circuit being different from said first circuit and a second inverter, the second circuit including a plurality of flip-flops connected in series, the second inverter receiving a signal which a final stage flip-flop in the second circuit has output, inverting the received signal and inputting the inverted signal into a first stage flip-flop in the second circuit.

6. The semiconductor integrated circuit according to claim 5, wherein the frequency dividing circuit further comprises a first selector outputting selected one of the output signal of the flip-flop included in the first circuit and the output signal of the final stage flip-flop included in the second circuit.

7. The semiconductor integrated circuit according to claim 1, wherein the target circuit further performs a scan path test using the scan chain, and wherein the clock switching circuit supplies a test clock signal to the scan chain when said target circuit performs the scan path test, the test clock signal being different from the save/recover clock signal and being slower than the system clock signal.

8. The semiconductor integrated circuit according to claim 7, wherein the clock switching circuit comprises a second selector outputting selected one of the system clock signal and the test clock signal.

9. The semiconductor integrated circuit according to claim 8, wherein the clock switching circuit further comprises a third selector outputting selected one of the output signal of the second selector and the save/recover clock signal generated by frequency dividing of the system clock signal.

10. The semiconductor integrated circuit according to claim 7, wherein the clock switching circuit comprises a frequency dividing circuit receiving selected one of the system clock signal and the test clock signal, performing frequency dividing of the received system clock signal, and outputting the received test clock signal without performing frequency dividing of the test clock signal.

11. The semiconductor integrated circuit according to claim 10, wherein the frequency dividing circuit comprises:
- an enable signal generating circuit outputting an enable signal, the enable signal being a clock signal generated by performing frequency dividing of the system clock signal when the target circuit performs the normal operation, the enable signal being a signal having a constant clock frequency when the target circuit performs the scan path test; and
- a clock gating cell outputting a signal being based on the enable signal and the system clock signal or the test clock signal.

12. A semiconductor integrated circuit, comprising:
- a target circuit configured to perform a normal operation based on a first clock signal and to perform a saving operation based on a second clock signal, a clock frequency of the second clock signal being lower than that of the first clock signal;
- a plurality of scan flip-flops provided within the target circuit and configured to form an internal register of the target circuit in the normal operation and to form a plurality of sub-scan chains in the saving operation, each of the sub-scan chains comprising a same number of the scan flip-flops and being configured to operate in parallel;
- a backup memory coupled to the target circuit and configured to operate based on the second clock signal; and
- a control circuit coupled to both the target circuit and the backup memory to backup data stored in the internal register to the backup memory through the plurality of sub-scan chains in the saving operation.

13. The semiconductor integrated circuit according to claim 12, wherein the target circuit is further configured to perform a recovering operation based on the second clock signal, and
wherein the control circuit restores the data stored in the backup memory to the internal register through the plurality of sub-scan chains in the recovering operation.

14. The semiconductor integrated circuit according to claim 13, wherein the control circuit includes a clock switching circuit configured to supply the first clock signal in the normal operation and to supply the second clock signal in both the saving and recovering operation, and
wherein the second clock signal comprises a divided clock signal of the first clock signal.

15. The semiconductor integrated circuit according to claim 14, further comprising a plurality of selectors provided within the target circuit,
wherein the target circuit is further configured to perform a test operation based on an external clock signal, and
wherein the plurality of sub-scan chains is connected in series using the plurality of selectors in the test operation to perform the test operation as a test scan chain.

16. The semiconductor integrated circuit according to claim 15, further comprising a switching circuit connected to the target circuit to control a power supply to the target circuit in response to a control signal output from the control circuit.

17. The semiconductor integrated circuit according to claim 12, wherein said sub-scan chains operate in parallel based on said save/recover clock signal, in said saving operation, and said internal state data is stored in said memory through said of sub-scan chains.

18. The semiconductor integrated circuit according to claim 17, wherein said internal state data which has been stored in said memory are set to an internal circuit through said plurality of sub-scan chains based on said save/recover clock signal again.

19. The semiconductor integrated circuit according to claim 17, wherein each of said plurality of sub-scan chains comprise an equal numbers of flip-flops.

20. The semiconductor integrated circuit according to claim 17, wherein, when a number of flip-flops contained in said plurality of sub-scan chains are not equal to each other, the clock gating does not supply a clock signal to one of the dummy flip-flops in said normal operation, is inserted into at least one of said plurality of sub-scan chains such that the numbers of flip-flops contained in said plurality of sub-scan chains are equal to each other.

* * * * *